(12) United States Patent
Kim et al.

(10) Patent No.: US 12,463,015 B2
(45) Date of Patent: Nov. 4, 2025

(54) SUBSTRATE PROCESSING APPARATUS AND METHOD USING THE PLASMA

(71) Applicant: SEMES CO., LTD., Chungcheongnam-do (KR)

(72) Inventors: Dong Hun Kim, Seoul (KR); Da Som Bae, Seoul (KR); Wan Jae Park, Gyeonggi-do (KR); Seong Gil Lee, Gyeonggi-do (KR); Young Je Um, Busan (KR); Ji Hwan Lee, Incheon (KR); Dong Sub Oh, Busan (KR); Myoung Sub Noh, Gyeonggi-do (KR); Joun Taek Koo, Seoul (KR); Du Ri Kim, Seoul (KR)

(73) Assignee: SEMES CO., LTD., Chungcheongnam-do (KR)

( * ) Notice: Subject to any disclaimer, the term of this patent is extended or adjusted under 35 U.S.C. 154(b) by 551 days.

(21) Appl. No.: 17/712,035

(22) Filed: Apr. 1, 2022

(65) Prior Publication Data

US 2023/0317415 A1    Oct. 5, 2023

(51) Int. Cl.
*H01J 37/32* (2006.01)
*H01L 21/3065* (2006.01)

(52) U.S. Cl.
CPC .... *H01J 37/3244* (2013.01); *H01J 37/32422* (2013.01); *H01J 37/32568* (2013.01); *H01L 21/3065* (2013.01); *H01J 2237/334* (2013.01)

(58) Field of Classification Search
None
See application file for complete search history.

(56) References Cited

U.S. PATENT DOCUMENTS 10,957,518 B2    3/2021    Ramaswamy et al.
2006/0042545 A1  3/2006    Shibata et al.
(Continued)

FOREIGN PATENT DOCUMENTS

JP    2004-353066    12/2004
JP    2022-501795    1/2022
(Continued)

OTHER PUBLICATIONS

Office Action for Taiwanese Patent Application No. 111112883 issued on Mar. 16, 2023 and its English translation by Google Translate.
(Continued)

*Primary Examiner* — Khaja Ahmad
(74) *Attorney, Agent, or Firm* — WOMBLE BOND DICKINSON (US) LLP

(57) ABSTRACT

A substrate processing apparatus and method capable of maximizing plasma uniformity are provided. The substrate processing method comprises providing a substrate processing apparatus including a processing space for processing a substrate and a plasma generating module for generating plasma for processing the substrate, wherein the plasma generating module comprises a plurality of first electrodes disposed in parallel with each other in a first direction, a plurality of second electrodes disposed in parallel with each other in a second direction different from the first direction, and an array including a plurality of micro plasma cells connected to the plurality of first electrodes and the plurality of second electrodes, providing a process gas to the plurality of micro plasma cells, and providing a reaction gas to the processing space, wherein a first micro plasma cell of the plurality of micro plasma cells is provided with a first energy of a first magnitude, and to a second micro plasma cell is provided with a second energy of a second magnitude
(Continued)

different from the first magnitude, so that an amount of radicals in plasma generated in the first micro plasma cell is different from an amount of radicals in plasma generated in the second micro plasma cell.

18 Claims, 12 Drawing Sheets

(56) References Cited

U.S. PATENT DOCUMENTS

| | | | |
|---|---|---|---|
| 2013/0084408 A1* | 4/2013 | Nakao | C23C 16/50 118/723 E |
| 2014/0138356 A1* | 5/2014 | Sawada | H01J 37/32568 216/67 |
| 2017/0092470 A1 | 3/2017 | Ramaswamy et al. | |
| 2019/0122866 A1* | 4/2019 | Nam | H01L 21/3065 |
| 2019/0122867 A1* | 4/2019 | Nam | H01J 1/025 |
| 2020/0185564 A1 | 6/2020 | Bruneau et al. | |

FOREIGN PATENT DOCUMENTS

| | | |
|---|---|---|
| KR | 10-2014-0036224 | 3/2014 |
| KR | 10-2014-0105585 | 9/2014 |
| KR | 10-2017-0039557 | 4/2017 |
| KR | 10-1765360 | 8/2017 |
| KR | 10-1947844 | 2/2019 |
| TW | 201905957 | 2/2019 |
| TW | 202209936 | 3/2022 |

OTHER PUBLICATIONS

Office Action for Japanese Patent Application No. 2022-055164 issued on Apr. 4, 2023 and its English translation by Google Translate.

Notice of Allowance dated Oct. 3, 2023 for Korean Patent Application No. 10-2020-0170227 and its English machine translation by Google Translate.

* cited by examiner

SUBSTRATE PROCESSING APPARATUS AND METHOD USING THE PLASMA

BACKGROUND

1. Field

The present disclosure relates to a substrate processing apparatus and method using plasma.

2. Description of the Related Art

When manufacturing a semiconductor device or a display device, various processes using plasma (e.g., etching, ashing, ion implantation, cleaning, etc.) may be used. A substrate processing apparatus using plasma may be classified into a capacitively coupled plasma (CCP) type and an inductively coupled plasma (ICP) type according to a plasma generation method. In the CCP type, two electrodes are disposed to face each other in a chamber, and an RF signal is applied to one or both of the two electrodes to form an electric field in the chamber to generate plasma. On the other hand, in the ICP type, one or more coils are installed in a chamber, and an RF signal is applied to the coil to induce an electromagnetic field in the chamber to generate plasma.

SUMMARY

On the other hand, in the case of a substrate processing apparatus using a conventional plasma (e.g., RDC (Radical Dry Clean) equipment), process parameters such as gas flow rate, ratio, pressure, and frequency and size of RF power is adjusted to improve the uniformity of plasma. Nevertheless, since the generated plasma may have an asymmetric shape, a multi-zone temperature control device may be added in the chuck, or a buffer space for diffusion of radicals or reaction gases may be secured. Accordingly, the structure of the substrate processing apparatus using plasma becomes complicated and the volume increases.

An object of the present disclosure is to provide a substrate processing apparatus capable of maximizing plasma uniformity.

Another object of the present disclosure is to provide a substrate processing method capable of maximizing plasma uniformity.

The objects of the present disclosure are not limited to the objects mentioned above, and other objects not mentioned will be clearly understood by those skilled in the art from the following description.

One aspect of the substrate processing apparatus of the present disclosure for achieving the above object comprises a processing space, in which a substrate is disposed; and a plasma generating module for generating plasma for processing the substrate, wherein the plasma generating module comprises a plurality of first electrodes disposed in parallel with each other in a first direction, a plurality of second electrodes disposed in parallel with each other in a second direction different from the first direction, and an array including a plurality of micro plasma cells, wherein each micro plasma cell is connected to corresponding first electrode and second electrode, and generates plasma according a first voltage applied to the corresponding first electrode and a second voltage applied to the corresponding second electrode.

Another aspect of the substrate processing apparatus of the present disclosure for achieving the above object comprises a plasma forming space; a first plate disposed above the plasma forming space, in which an inlet for introducing a process gas into the plasma forming space is formed; a second plate disposed under the plasma forming space, in which an outlet for filtering some components of plasma formed in the plasma forming space is formed; a first electrode installed on the first plate and elongated in a first direction; a second electrode installed on the second plate and elongated in a second direction different from the first direction; and a bypass line passing through the plasma forming space to connect the first plate and the second plate, and for delivering an unexcited reaction gas.

One aspect of the substrate processing method of the present disclosure for achieving the above object comprises providing a substrate processing apparatus including a processing space for processing a substrate and a plasma generating module for generating plasma for processing the substrate, wherein the plasma generating module comprises a plurality of first electrodes disposed in parallel with each other in a first direction, a plurality of second electrodes disposed in parallel with each other in a second direction different from the first direction, and an array including a plurality of micro plasma cells connected to the plurality of first electrodes and the plurality of second electrodes, providing a process gas to the plurality of micro plasma cells, and providing a reaction gas to the processing space, wherein a first micro plasma cell of the plurality of micro plasma cells is provided with a first energy of a first magnitude, and to a second micro plasma cell is provided with a second energy of a second magnitude different from the first magnitude, so that an amount of radicals in plasma generated in the first micro plasma cell is different from an amount of radicals in plasma generated in the second micro plasma cell.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
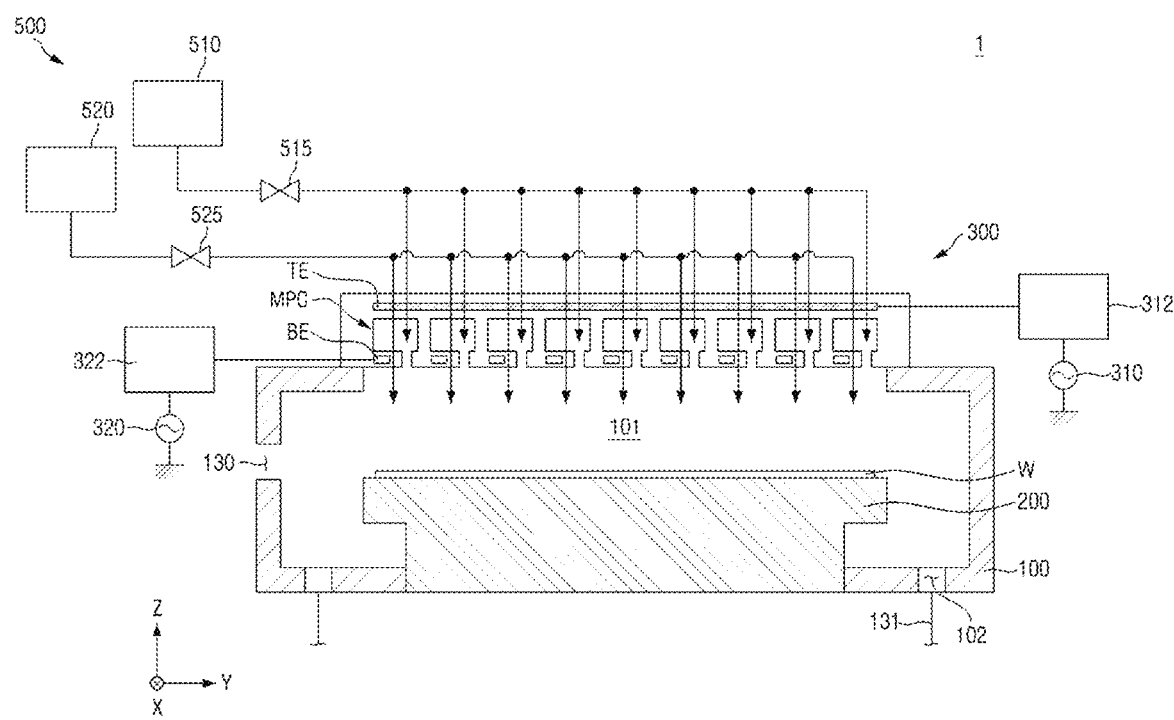
FIG. 1 is a cross-sectional view for describing a substrate processing apparatus according to a first embodiment of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

Figure 2:
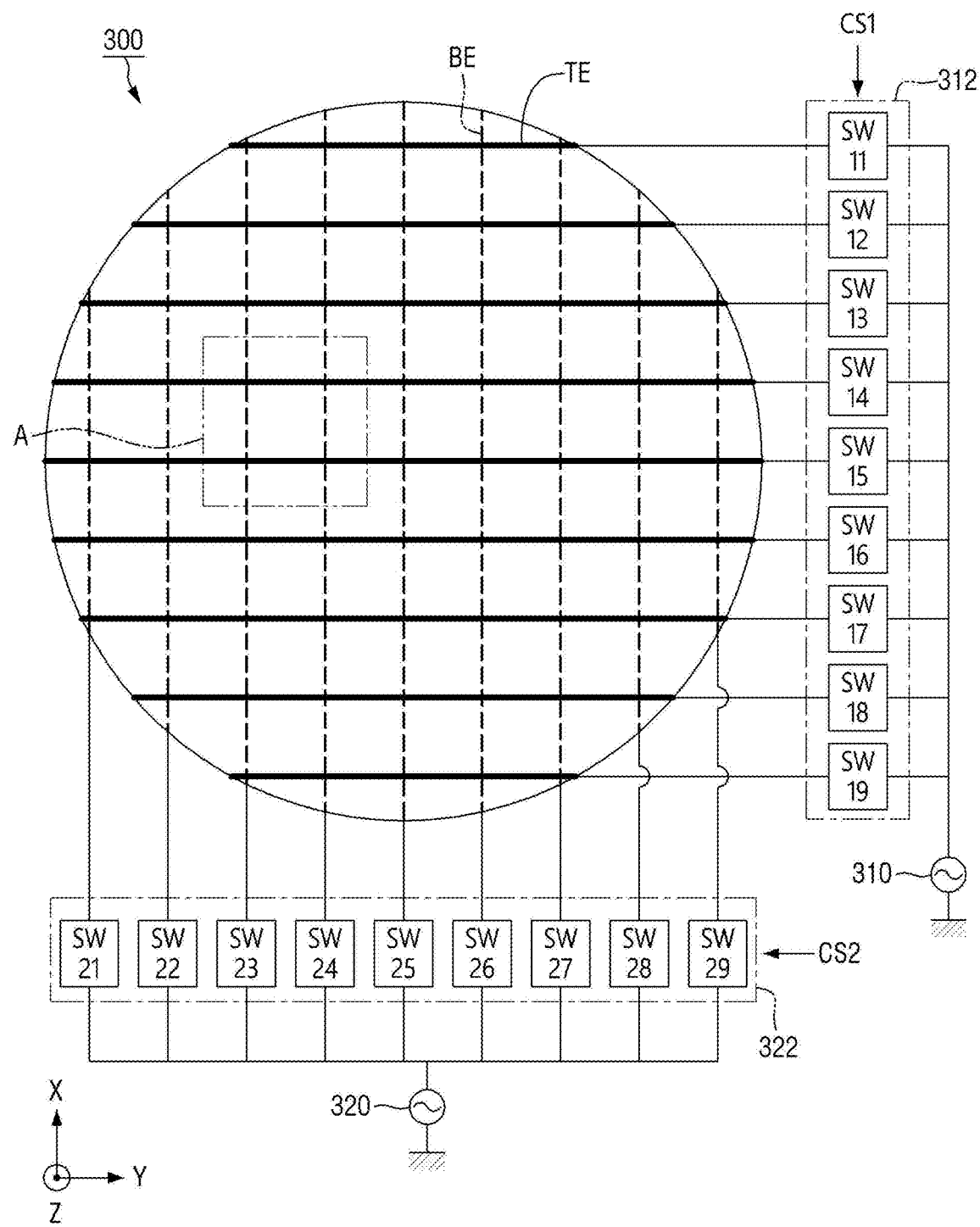
FIG. 2 is a plan view illustrating the plasma generating module of FIG. 1.
Figure 3:
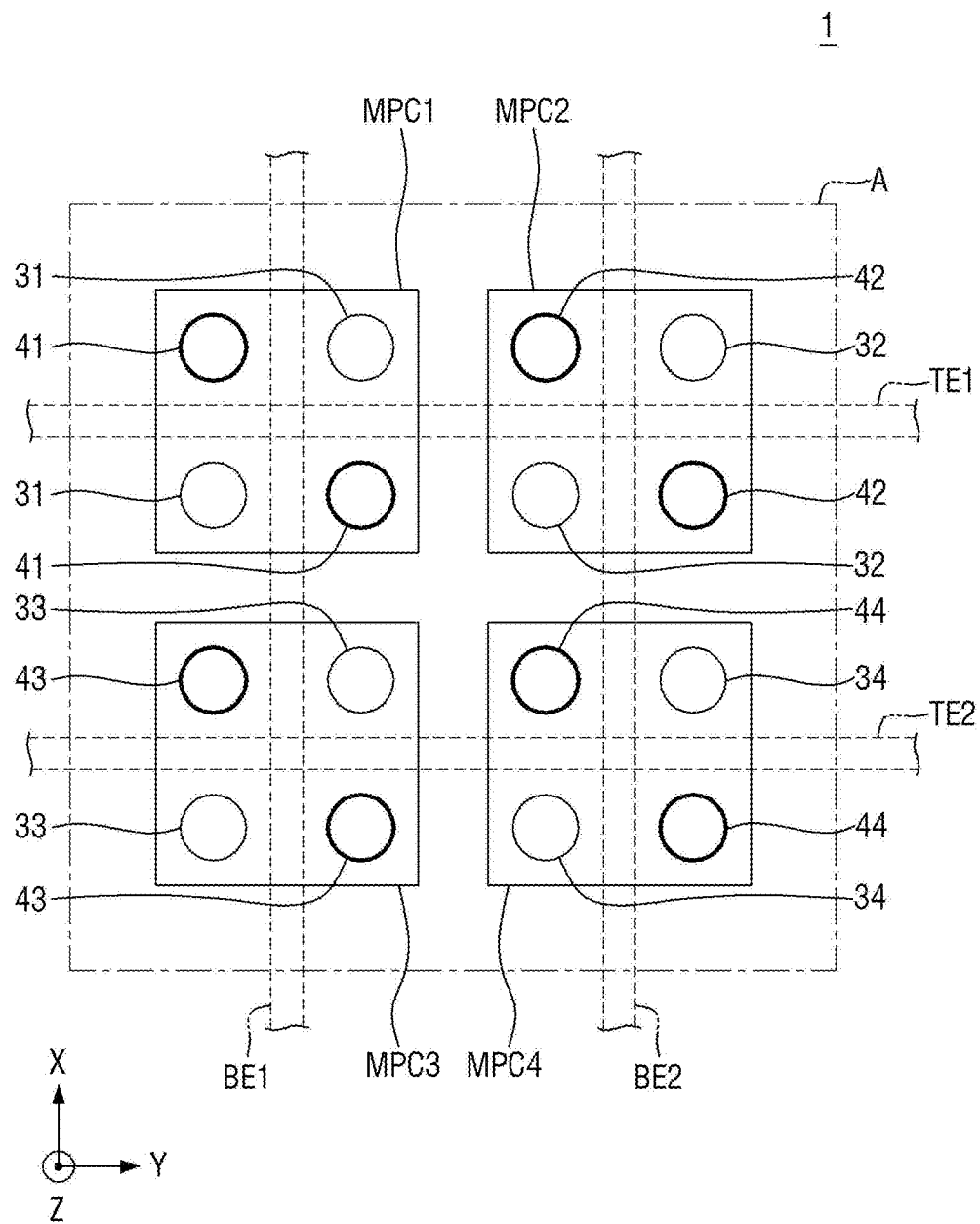
FIG. 3 is an enlarged plan view of region A of FIG. 2.
Figure 4:
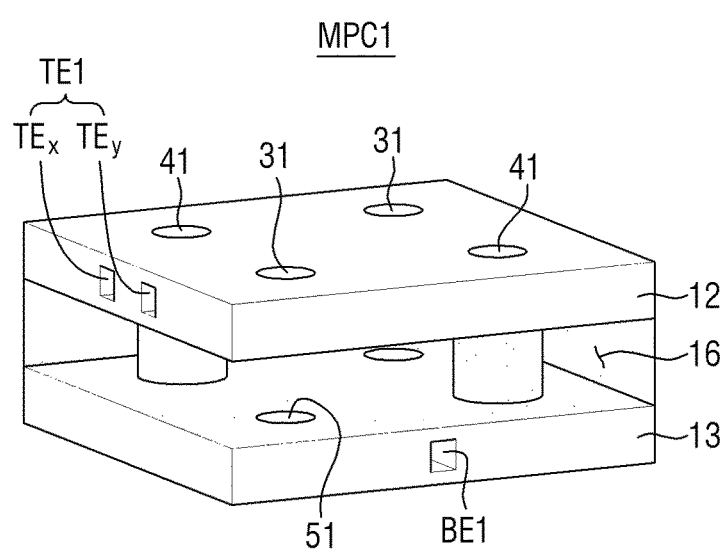
FIG. 4 is a perspective view for describing the micro plasma cell MPC1 of FIG. 3.

FIG. 1 is a cross-sectional view for describing a substrate processing apparatus according to a first embodiment of the present disclosure. FIG. 2 is a plan view illustrating the plasma generating module of FIG. 1. FIG. 3 is an enlarged plan view of region A of FIG. 2. FIG. 4 is a perspective view illustrating the micro plasma cell MPC1 of FIG. 3.

First, referring to FIG. 1, the substrate processing apparatus 1 according to the first embodiment of the present disclosure includes a process chamber 100, a support module 200, a plasma generating module 300, a gas supply module 500, and the like.

The process chamber 100 provides a processing space 101, in which the substrate W is processed. The process chamber 100 may have a circular cylindrical shape. The process chamber 100 is provided with a metal material. For example, the process chamber 100 may be provided with an aluminum material. An opening 130 is formed in one sidewall of the process chamber 100. The opening 130 is used as an entrance through which the substrate W can be carried in and out. The entrance can be opened and closed by a door. An exhaust port 102 is installed on the bottom surface of the process chamber 100. The exhaust port 102 serves as an outlet through which byproducts generated in the processing space 101 are discharged to the outside of the process chamber 100. The exhaust port 102 is connected to the exhaust line 131. The exhaust operation is performed by the pump.

The support module 200 is installed in the processing space 101 and supports the substrate W. The support module 200 may be an electrostatic chuck that supports the substrate W using an electrostatic force, but is not limited thereto. The electrostatic chuck may include a dielectric plate, on which the substrate W is placed, an electrode installed in the dielectric plate and providing electrostatic force so that the substrate W is adsorbed to the dielectric plate, and a heater installed in the dielectric plate and heating the substrate W to control the temperature of the substrate W.

The gas supply module 500 supplies a gas necessary for substrate processing to the plasma generating module 300 and/or the processing space 101.

Specifically, the first gas supply module 510 provides a process gas to the plurality of micro plasma cells MPC. The process gas may include, for example, an inert gas such as Ar or He, and a gas ($C_xF_y$, $N_xF_y$, etc.) comprising a compound including at least one of C, N, and F.

The second gas supply module 520 provides a reaction gas to the processing space 101. The reaction gas bypasses the micro plasma cell MPC and may be directly provided to the processing space 101 without being excited by plasma. The reaction gas may include, for example, a gas ($H_2$, $NH_3$, etc.) comprising a compound including at least one of H and N.

The plasma generating module 300 generates plasma using a process gas to provide at least some components (e.g., radicals) of plasma for processing the substrate W to the processing space 101.

Here, the plasma generating module will be described in detail with reference to FIGS. 1 and 2. For convenience of explanation, in FIG. 2, the micro plasma cell MPC is not illustrated, but the arrangement of the plurality of first electrodes TE and the plurality of second electrodes BE is mainly illustrated.

The plasma generating module 300 includes an array including a plurality of first electrodes TE, a plurality of second electrodes BE, and a plurality of micro plasma cells MPC.

The plurality of first electrodes TE are disposed in parallel with each other in the first direction X. Each of the first electrodes TE is disposed to be elongated in the second direction Y. The plurality of first electrodes TE are connected to the first power supply 310 through the first switching box 312.

The plurality of second electrodes BE are disposed in parallel with each other in the second direction Y. Each of the second electrodes BE is disposed to be elongated in the first direction X. The plurality of first electrodes TE are connected to the second power supply 320 through the second switching box 322.

As exemplarily shown in FIG. 2, the first switching box 312 includes a plurality of first switches SW11 to SW19, and each of the first switches SW11 to SW19 is connected to a corresponding first electrode TE. The second switching box 322 includes a plurality of second switches SW21 to SW29, and each of the second switches SW21 to SW29 is connected to a corresponding second electrode BE.

A plurality of micro plasma cells MPC are disposed in an array in a first direction X and a second direction Y, and each micro plasma cell MPC is connected to a corresponding first electrode TE and second electrode BE. Although not shown in FIG. 2, the micro plasma cell MPC is located in a region, where the first electrode TE and the second electrode BE intersect. For example, a corresponding first electrode TE may be connected to one side (e.g., upper side) of each micro plasma cell MPC, and a corresponding second electrode BE may be connected to the other side (e.g., lower side).

The first switching box 312 receives the first selection signal CS1, and the second switching box 322 receives the second selection signal CS2. For example, if the first selection signal CS1 is a signal for selecting the first switch SW14 (that is, a signal for turning on the first switch SW14), and the second selection signal CS2 is a signal for selecting the second switch SW23 (that is, a signal for turning on the second switch SW23), a micro plasma cell MPC where the first electrode TE connected to the first switch SW14 and the second electrode BE connected to the second switch SW23 intersect is selected. Since the first switch SW14 is turned on, the first voltage is provided to the selected micro plasma cell MPC from the first power supply 310, and since the second switch SW23 is turned on, the second voltage is provided to the selected micro plasma cell MPC from the second power supply 320, such that the selected micro plasma cell MPC generates plasma using the process gas.

Meanwhile, although it has been described that the micro plasma cells MPC are arranged in a circle in FIG. 2, the present disclosure is not limited thereto. That is, the micro plasma cells MPC may be arranged in a rectangular shape.

Here, a specific shape of the micro plasma cell MPC will be described with reference to FIGS. 3 and 4.

As shown in FIG. 3, the plurality of first electrodes TE1 and TE2 are disposed in parallel with each other in the first direction X, and the plurality of second electrodes BE1 and BE2 are disposed in parallel with each other in the second direction Y.

The first micro plasma cell MPC1 is disposed in a region where the first electrode TE1 and the second electrode BE1 intersect, the second micro plasma cell MPC2 is disposed in a region where the first electrode TE1 and the second electrode BE2 intersect, the third micro plasma cell MPC3 is disposed in a region where the first electrode TE2 and the second electrode BE1 intersect, and the fourth micro plasma cell MPC4 is disposed in a region where the first electrode TE2 and the second electrode BE2 intersect.

As shown in FIG. 4, the first micro plasma cell MPC1 includes a plasma forming space 16, a first plate 12, a second plate 13, and the like.

The first plate 12 is disposed on one side of the plasma forming space 16. The first plate 12 may be made of a dielectric material (e.g., $Y_2O_3$, $Al_2O_3$) having a non-conductive property.

In addition, the first electrode TE1 corresponding to the first micro plasma cell MPC1 is installed on the first plate 12, and an inlet 31 for introducing a process gas into the plasma forming space 16 may be formed.

The first electrode TE1 may be installed inside the first plate 12 or on one surface (e.g., an upper surface) of the first plate 12. As illustrated, the first electrode TE1 may be disposed to pass through the center of the plasma forming space 16, but is not limited thereto. That is, the plasma forming space 16 may be disposed to be biased toward one side.

As illustrated in FIG. 4, the first electrode TE1 may include two bus electrodes TEx and TEy. The two bus electrodes TEx and TEy may be disposed in parallel with each other in the first direction X. However, the shape and/or configuration of the first electrode TE1 may vary depending on a voltage application method.

The second plate 13 is disposed on the other side of the plasma forming space 16. The second plate 13 may be formed of a dielectric having a non-conductive property (e.g., $Y_2O_3$ or $Al_2O_3$).

In addition, the second electrode BE1 corresponding to the first micro plasma cell MPC1 is installed on the second plate 13, and an outlet 51 for filtering some components of the plasma formed in the plasma forming space 16 is formed. The outlet 51 blocks the ion component of the formed plasma, and allows radicals of the plasma to pass therethrough. By determining the size of the outlet 51 in consideration of the thickness of the sheath of the plasma to be formed, the ion component of the plasma may be blocked. For example, when the outlet 51 is circular, if the radius of the outlet 51 is determined to be smaller than the thickness of the sheath, the ion component of the plasma may not pass through the outlet 51.

The second electrode BE1 may be installed inside the second plate 13 or on the other surface (e.g., the lower surface) of the second plate 13. As illustrated, the second electrode BE1 may be disposed to pass through the center of the plasma forming space 16, but is not limited thereto. That is, the plasma forming space 16 may be disposed to be biased toward one side.

In addition, a bypass line 41 may be further installed in the first micro plasma cell MPC1. The bypass line 41 passes through the plasma forming space 16 to connect the first plate 12 and the second plate 13. The reaction gas may be provided to the processing space (see 101 of FIG. 1) by bypassing the first micro plasma cell MPC1 through the bypass line 41. By installing the bypass line 41 to pass through the first micro plasma cell MPC1, the space can be reduced compared to separately installing the bypass line regardless of the first micro plasma cell MPC1.

Referring back to FIG. 3, the inlets 31 and 32 are disposed on both sides of the first electrode TE1 with respect to the first electrode TE1. The inlets 33 and 34 are disposed on both sides of the first electrode TE2 with respect to the first electrode TE2. Similarly, the bypass lines 41 and 42 are disposed on both sides of the first electrode TE1 with respect to the first electrode TE1. The bypass lines 43 and 44 are disposed on both sides of the first electrode TE2 with respect to the first electrode TE2.

In addition, the inlets 31 and 33 are disposed on both sides of the second electrode BE1 with respect to the second electrode BE1. The inlets 32 and 34 are disposed on both sides of the second electrode BE2 with respect to the second electrode BE2. Similarly, the bypass lines 41 and 43 are disposed on both sides of the second electrode BE1 with respect to the second electrode BE1. The bypass lines 42 and 44 are disposed on both sides of the second electrode BE2 with respect to the second electrode BE2.

Accordingly, in each micro plasma cell (e.g., MPC1), two inlets 31 may be located in a diagonal direction, and two bypass lines 41 may be located in a diagonal direction. Plasma can be uniformly formed in the plasma forming space 16 by being disposed in this way, and radical components of plasma are uniformly transferred to the processing space (see 101 of FIG. 1), so that a stable substrate processing operation can be performed.

Referring back to FIG. 4, the operation process of the micro plasma cell MPC1 will be described. When a preset voltage is applied to the bus electrode TEy among the first electrodes TE, and a preset voltage is applied to the second electrode BE, electric charges are formed around the first plate 12 and the second plate 13. Subsequently, when a preset voltage is alternately applied to the bus electrode TEx and the bus electrode TEy, a discharge occurs in the plasma forming space 16 to excite the process gas to form plasma.

Ion components in the formed plasma are filtered at the outlet 51 and do not pass through the outlet 51, and radical components (e.g., F radicals) pass through the outlet 51 and may be provided to the processing space (see 101 in FIG. 1). Meanwhile, the reaction gas passes through the micro plasma cell MPC1 and is provided to the processing space 101. In the processing space 101, a radical component and a reaction gas chemically react to form an etchant (e.g., $NH_4F^* \cdot HF^*$, $NH_4F^*$), and substrate processing is performed by the etchant.

In summary, in the substrate processing apparatus 1 according to the first embodiment of the present disclosure, a plurality of micro plasma cells MPC arranged in an array form are used. Accordingly, by controlling the voltage and/or the process gas provided to each micro plasma cell MPC, the size, density, etc. of plasma generated in each micro plasma cell MPC may be controlled. Accordingly, the amount and density of radicals of plasma delivered to the processing space 101 may also be controlled. In addition, since the reaction gas is provided by passing through the micro plasma cell MPC, the amount of the etchant generated by the chemical reaction between radicals and the reaction gas can be uniformly controlled. Also, since the substrate processing apparatus 1 has the bypass line 41 passing through the micro plasma cell MPC, the overall volume of the substrate processing apparatus 1 can be reduced.

Figure 5:
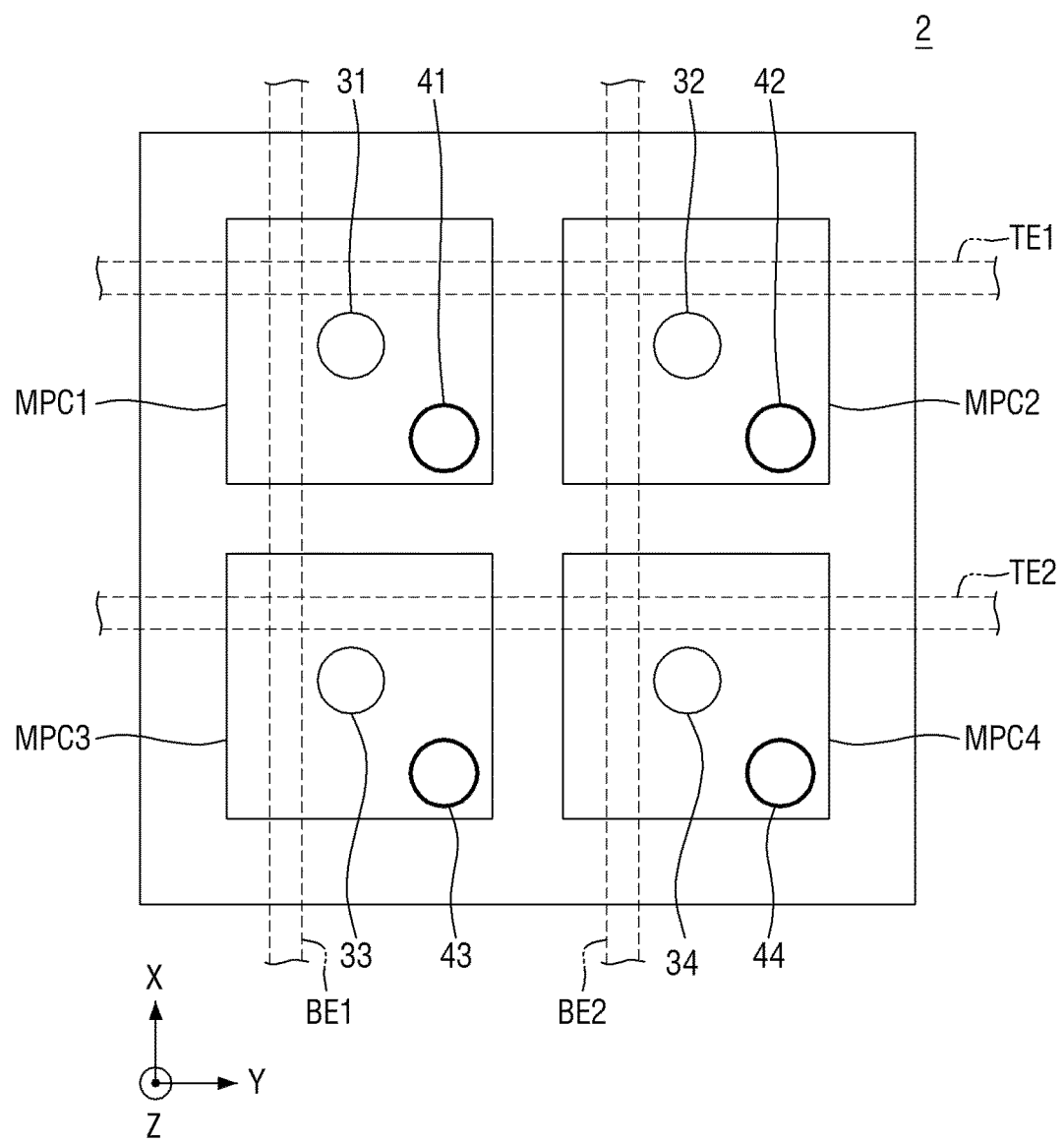
FIG. 5 is a plan view for describing a substrate processing apparatus according to a second embodiment of the present disclosure.

FIG. 5 is a plan view for describing a substrate processing apparatus according to a second embodiment of the present disclosure. For convenience of description, the points different from those described with reference to FIGS. 1 to 4 will be mainly described.

Referring to FIG. 5, in the substrate processing apparatus 2 according to the second embodiment of the present disclosure, the inlets 31 and 32 are disposed on one side of the first electrode TE1 with respect to the first electrode TE1. The inlets 33 and 34 are disposed on one side of the first electrode TE2 with respect to the first electrode TE2. Similarly, the bypass lines 41 and 42 are disposed on one side of the first electrode TE1 with respect to the first electrode TE1. The bypass lines 43 and 44 are disposed on one side of the first electrode TE2 with respect to the first electrode TE2.

In addition, the inlets 31 and 33 are disposed on one side of the second electrode BE1 with respect to the second electrode BE1. The inlets 32 and 34 are disposed on one side of the second electrode BE2 with respect to the second electrode BE2. Similarly, the bypass lines 41 and 43 are also disposed on one side of the second electrode BE1 with respect to the second electrode BE1. The bypass lines 42 and 44 are disposed on one side of the second electrode BE2 with respect to the second electrode BE2.

That is, in each micro plasma cell (e.g., MPC1), the first electrode TE1 and the second electrode BE1 may be disposed to be biased toward one side of the plasma forming space, and the inlet 31 and a bypass line 41 may be disposed in the remaining space of the plasma forming space. When the size of the micro plasma cell MPC1 is reduced, it may be difficult to install the two inlets 31 and the two bypass lines 41 in the micro plasma cell MPC1 as shown in FIG. 3.

In this case, the inlet 31 may be disposed at the center of the micro plasma cell MPC1, and the bypass line 41 may be disposed around the inlet 31. Plasma can be uniformly formed in the plasma forming space 16 by being arranged in this way, and radical components of plasma are uniformly transferred to the processing space (see 101 of FIG. 1), so that a stable substrate processing operation can be performed.

Figure 6:
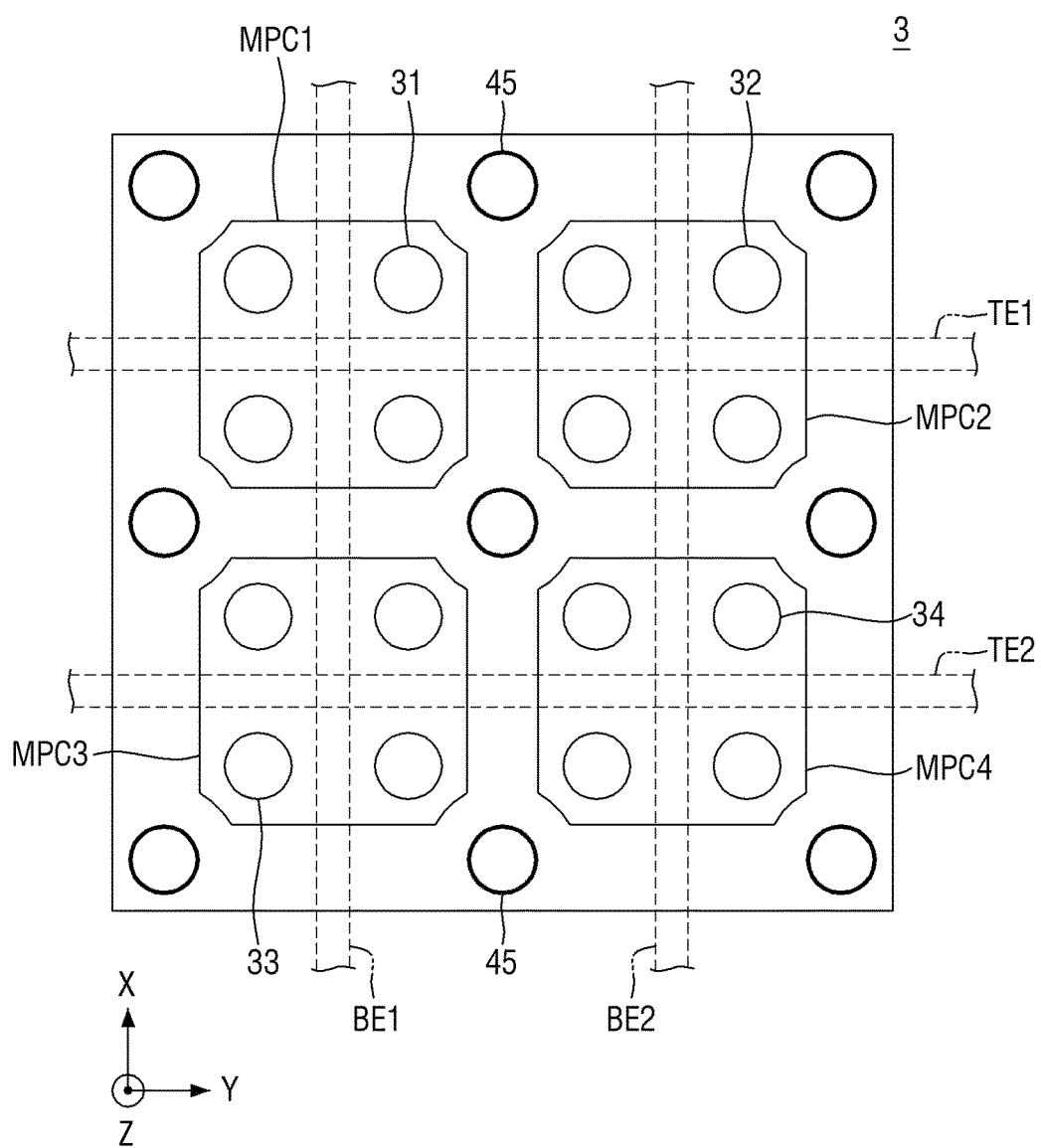
FIG. 6 is a plan view for describing a substrate processing apparatus according to a third embodiment of the present disclosure.

FIG. 6 is a plan view for describing a substrate processing apparatus according to a third embodiment of the present disclosure. For convenience of description, the points different from those described with reference to FIGS. 1 to 5 will be mainly described.

Referring to FIG. 6, in the substrate processing apparatus 3 according to the third embodiment of the present disclosure, inlets 31 to 34 are disposed in each of the micro plasma cells MPC1 to MPC4, and a bypass line 45 is not disposed.

The bypass line 45 may be installed in a region for separating the micro plasma cells MPC1 to MPC4 from each other. For example, sidewalls may be formed between the adjacent micro plasma cells MPC1 to MPC4, and the bypass line 45 may be disposed passing through the sidewall. Here, the sidewall may mean a wall surrounding the plasma forming space 16 to define a plasma forming space (e.g., see 16 of FIG. 4) in the micro plasma cell (e.g., MPC1).

In particular, as illustrated, by installing the bypass line 45 in the corner space of the adjacent micro plasma cells MPC1 to MPC4, the space for installing the bypass line 45 can be minimized.

Figure 7:
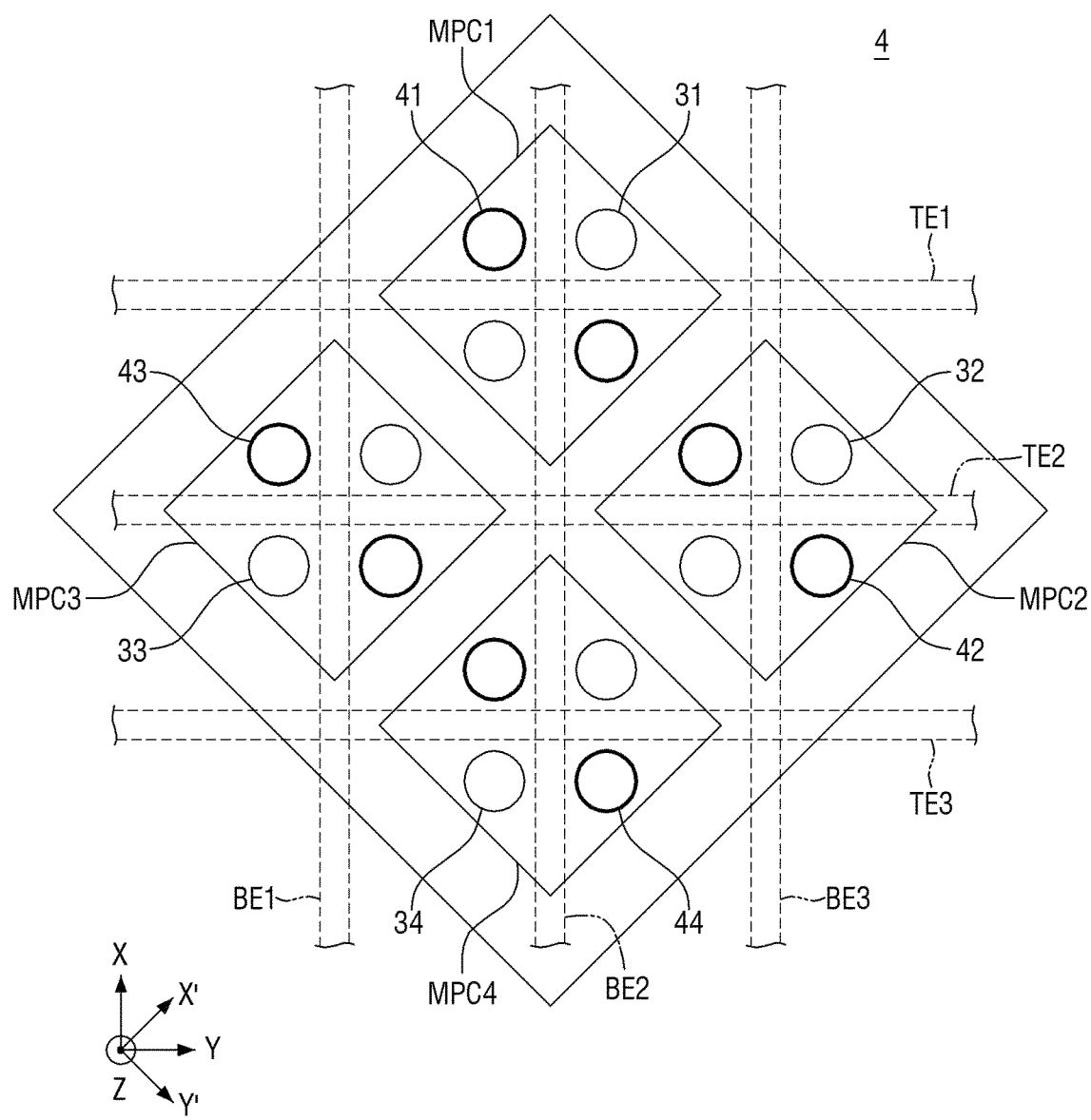
FIG. 7 is a plan view for describing a substrate processing apparatus according to a fourth embodiment of the present disclosure.

FIG. 7 is a plan view for describing a substrate processing apparatus according to a fourth embodiment of the present disclosure. For convenience of description, the points different from those described with reference to FIGS. 1 to 6 will be mainly described.

Referring to FIG. 7, in the substrate processing apparatus 4 according to the fourth embodiment of the present disclosure, the first electrodes TE1, TE2, and TE3 are disposed in parallel with each other in the first direction X, and the second electrode BE1, BE2, and BE3 are disposed in parallel with each other in the second direction Y. On the other hand, the micro plasma cells MPC1 to MPC4 may form an array in a direction other than the first direction X and the second direction Y. For example, in FIG. 7, the micro plasma cells MPC1 to MPC4 form an array in a direction X' and a direction Y'. For example, the direction X' may be inclined at 45° with respect to the first direction X, and the direction Y' may be inclined at 45° with respect to the second direction Y.

The inlet 31 and the bypass line 41 are disposed on both sides of the first electrode TE1 with respect to the first electrode TE1. The inlets 32 and 33 and the bypass lines 42 and 43 are disposed on both sides of the first electrode TE2 with respect to the first electrode TE2. The inlet 34 and the bypass line 44 are disposed on both sides of the first electrode TE3 with respect to the first electrode TE3.

In addition, the inlet 33 and the bypass line 43 are disposed on both sides of the second electrode BE1 with respect to the second electrode BE1. The inlets 31 and 34 and the bypass lines 41 and 44 are disposed on both sides of the second electrode BE2 with respect to the second electrode BE2. The inlet 32 and the bypass line 42 are disposed on both sides of the second electrode BE3 with respect to the second electrode BE3.

Figure 8:
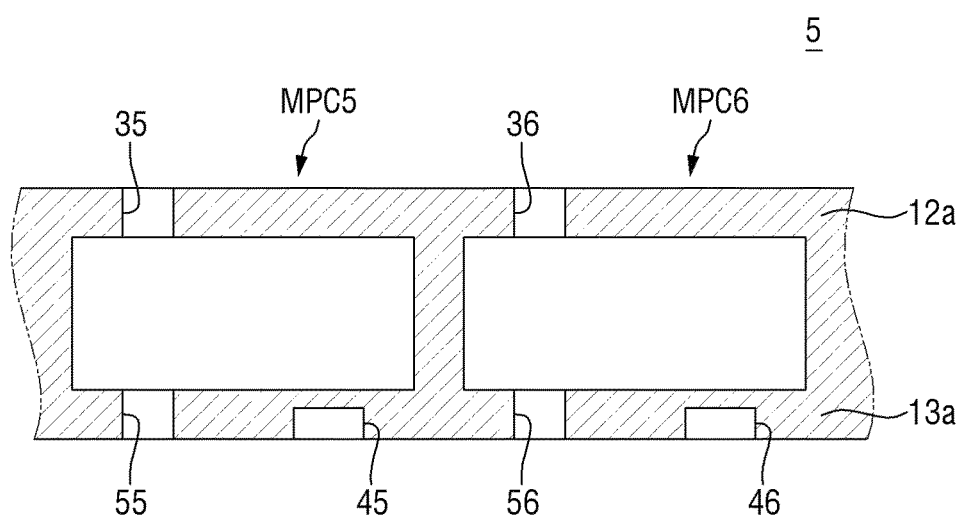
FIG. 8 is a plan view for describing a substrate processing apparatus according to a fifth embodiment of the present disclosure.

FIG. 8 is a plan view for describing a substrate processing apparatus according to a fifth embodiment of the present disclosure. For convenience of description, the points different from those described with reference to FIGS. 1 to 7 will be mainly described, and the first electrode and the second electrode are not shown in FIG. 8.

Referring to FIG. 8, in the substrate processing apparatuses 1 to 4 according to the first to fourth embodiments of the present disclosure, the reaction gas is supplied through the bypass lines 41 to 44 by passing through the micro plasma cells MPC1 to MPC4.

On the other hand, in the substrate processing apparatus 5 according to the fifth embodiment of the present disclosure, the micro plasma cells MPC5 and MPC6 do not include bypass lines. The inlets 35 and 36, through which the process gas is provided, are installed in the first plate (i.e., the upper plate) 12*a* of the micro plasma cells MPC5 and MPC6, and the outlets 55 and 56 for blocking some components (e.g., ion components) of the formed plasma and allowing radicals to pass therethrough are installed in the second plate (e.g., the lower plate) 13*a*.

A reaction gas line and supply holes 45 and 46 may be installed in the second plate 13*a*. The reaction gas may be moved along the reaction gas line and provided to the processing space 101 through the supply holes 45 and 46.

Hereinafter, a substrate processing method according to some embodiments of the present disclosure will be described with reference to FIGS. 9 to 14.

Figure 9:
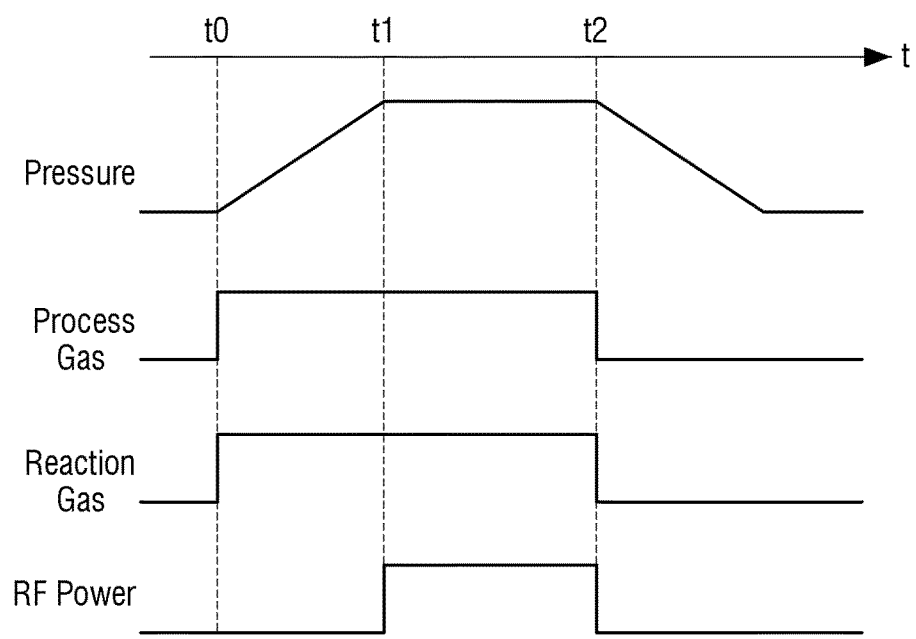
FIG. 9 illustrates a substrate processing method according to the first embodiment of the present disclosure.

FIG. 9 illustrates a substrate processing method according to the first embodiment of the present disclosure.

Referring to FIGS. 3, 4 and 9, at time t0, the process gas starts to be supplied to the plasma forming space 16 of the micro plasma cells MPC1 to MPC4 through the inlets 31 to 34. The reaction gas starts to be supplied to the processing space 101 through the bypass lines 41 to 44. Accordingly, the pressures in the plasma forming space 16 and the processing space 101 start to increase. The process gas may be a fluorine containing gas (e.g., nitrogen trifluoride), and the reaction gas may be a nitrogen and hydrogen containing gas (e.g., ammonia).

At time t1, the pressures in the plasma forming space 16 and the processing space 101 reach preset values. A preset voltage is applied to the first electrodes TE1 and TE2 and the second electrodes BE1 and BE2. For example, an appropriate high-frequency voltage may be applied to the first electrodes TE1 and TE2. A preset voltage may be alternately applied to the bus electrode TEx and the bus electrode TEy of the first electrodes TE1 and TE2. A ground voltage may be applied to the second electrodes BE1 and BE2. Plasma is formed from time t1 to time t2, and processing of the substrate proceeds in the processing space 101.

At time t2, voltage application to the first electrodes TE1 and TE2 and the second electrodes BE1 and BE2 is stopped. Then, the plasma forming space 16 and the processing space 101 start to exhaust.

In FIG. 9, it has been described that the pressures of the plasma forming space 16 and the processing space 101 reach a preset value at the same time point (i.e., time t1), but the present disclosure is not limited thereto. That is, the pressures of the plasma forming space 16 and the processing space 101 may reach preset values at different time points. In this case, after both the pressures of the plasma forming space 16 and the processing space 101 reach a preset value, a preset voltage is applied to the first electrodes TE1 and TE2 and the second electrodes BE1 and BE2.

Figure 10:
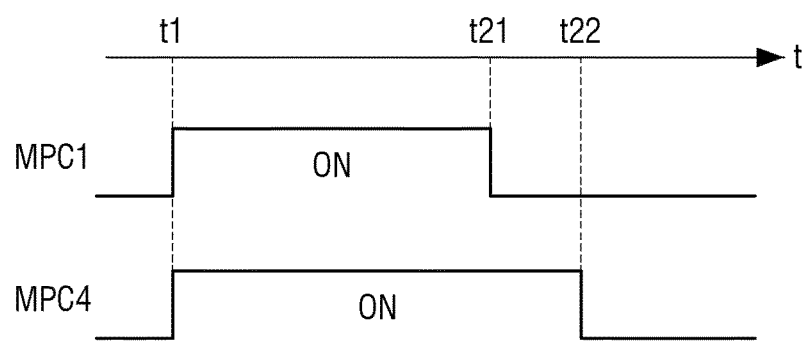
FIG. 10 illustrates a substrate processing method according to a second embodiment of the present disclosure.

FIG. 10 illustrates a substrate processing method according to a second embodiment of the present disclosure. For convenience of description, the points different from those described with reference to FIG. 9 will be mainly described.

In FIG. 9, voltage application was started at the same time point (i.e., time t1) to all the micro plasma cells MPC1 to MPC4, and voltage application was stopped at the same time point (i.e., time t2).

On the other hand, in FIG. 10, a section for applying a voltage to each of the micro plasma cells MPC1 to MPC4 may be differently adjusted. For example, a voltage is applied to the micro plasma cell MPC1 for a first time period (i.e., time t1 to time t21) to form plasma. On the other hand, a voltage may be applied to the micro plasma cell MPC4 for a second time period different from the first time period (i.e., time t1 to time t22) to form plasma.

In FIG. 10, the start time (time t1) of applying a voltage to the micro plasma cells MPC1 and MPC4 is illustrated as the same, but the present disclosure is not limited thereto.

According to the substrate processing method according to the second embodiment of the present disclosure, it is possible to adjust the time, for which each of the micro plasma cells MPC1 to MPC4 generates plasma. For example, if one part of the substrate W does not perform plasma cleaning well compared to the other part, the micro plasma cell MPC4 corresponding to the one part generates plasma for a relatively long time, and the micro plasma cell MPC1 corresponding to the other part generates plasma for a relatively short time. By doing in this way, the substrate processing result can be made uniform with respect to the entire substrate W.

Figure 11:
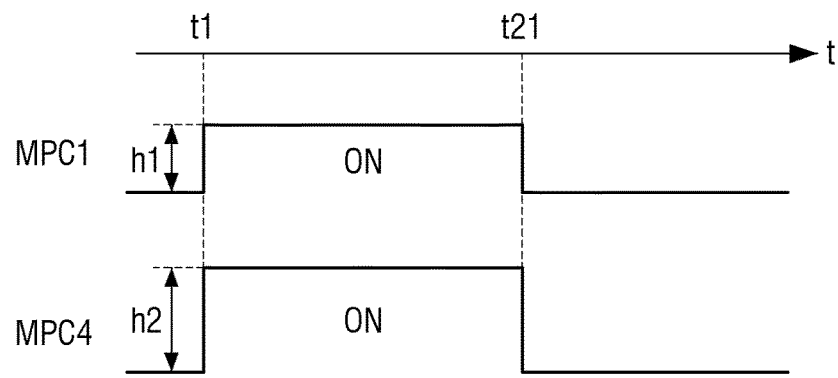
FIG. 11 illustrates a substrate processing method according to a third embodiment of the present disclosure.

FIG. 11 illustrates a substrate processing method according to a third embodiment of the present disclosure. For convenience of description, the points different from those described with reference to FIGS. 9 and 10 will be mainly described.

In FIG. 11, the level of a voltage (i.e., energy) applied to each of the micro plasma cells MPC1 to MPC4 may be adjusted differently. For example, a voltage of a first level h1 (or energy of a first magnitude h1) is applied to the micro plasma cell MPC1, and a voltage of a second level h2 (or energy of the second magnitude h2) different from the first level h1 is applied to the micro plasma cell MPC4. By doing in this way, the amount of plasma generated in the micro plasma cell MPC1 and the micro plasma cell MPC4 can be different. Accordingly, the amount of radicals in the plasma generated in the micro plasma cell MPC1 and the amount of radicals in the plasma generated in the micro plasma cell MPC4 can be adjusted differently.

For example, if one part of the substrate W does not perform plasma cleaning well compared to the other part, a relatively large voltage is applied to the micro plasma cell MPC4 corresponding to the one part to generate plasma, and a relatively small voltage is applied to the micro plasma cell MPC1 corresponding to the other part to generate plasma. By doing in this way, the substrate processing result can be made uniform with respect to the entire substrate W.

Although not shown separately, the methods described with reference to FIGS. 10 and 11 may be combined. That is, the magnitude and provision time of energy provided to generate plasma in the micro plasma cell MPC4 may be adjusted differently from the magnitude and provision time of energy provided to generate plasma in the micro plasma cell MPC1.

Figure 12:
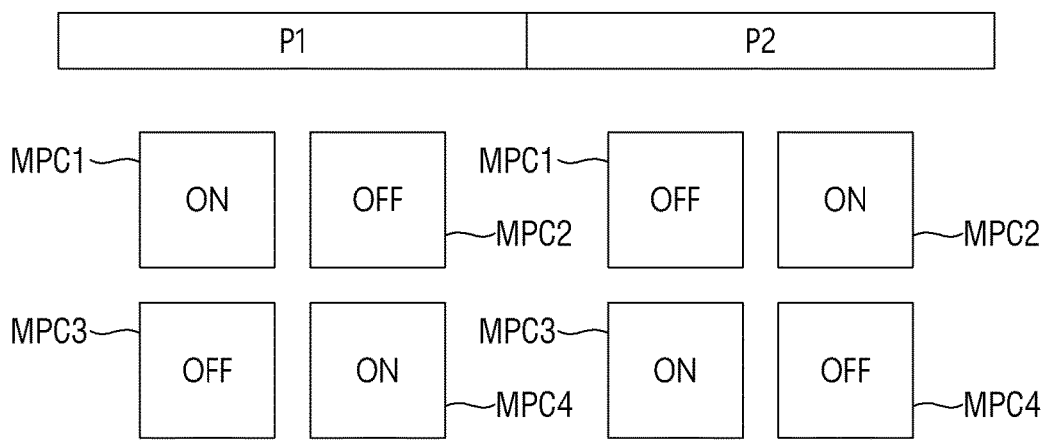
FIG. 12 illustrates a substrate processing method according to a fourth embodiment of the present disclosure.
Figure 13:
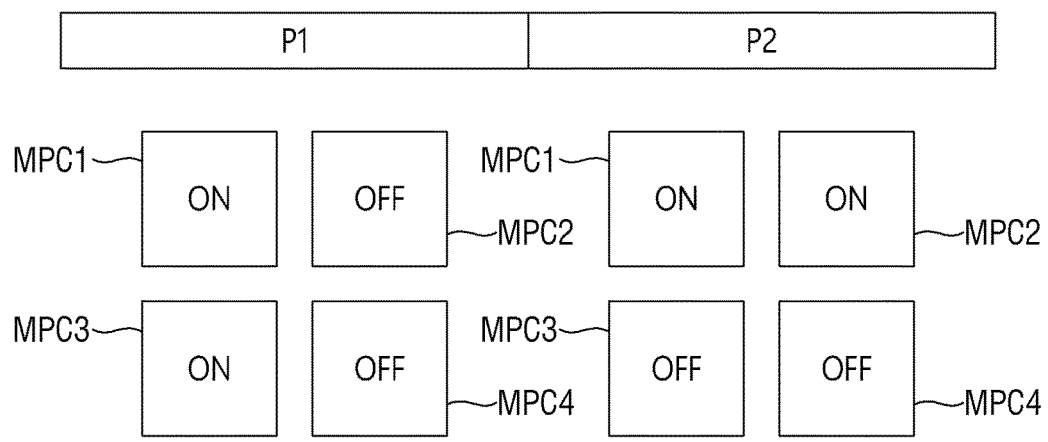
FIG. 13 illustrates a substrate processing method according to a fifth embodiment of the present disclosure.

FIG. 12 illustrates a substrate processing method according to a fourth embodiment of the present disclosure. FIG. 13 illustrates a substrate processing method according to a fifth embodiment of the present disclosure.

Referring to FIGS. 12 and 13, in order to make the substrate processing result uniform for the entire substrate W, the micro plasma cells MPC1 to MPC4 that generate plasma may be different according to the sections P1 and P2.

In the drawing, "ON" means that an appropriate voltage is applied to the corresponding micro plasma cell (e.g., MPC1) to generate plasma. In the drawing, "OFF" means that the corresponding micro plasma cell (e.g., MPC1) does not generate plasma.

As shown in FIG. 12, in the first section P1, the first and fourth micro plasma cells MPC1 and MPC4 generate plasma, and the second and third micro plasma cells MPC2 and MPC3 do not generate plasma.

In the second section P2, the first and fourth micro plasma cells MPC1 and MPC4 do not generate plasma, and the second and third micro plasma cells MPC2 and MPC3 generate plasma.

The first section P1 and the second section P2 may alternately and repeatedly proceed.

As shown in FIG. 13, in the first section P1, the first and third micro plasma cells MPC1 and MPC3 generate plasma, and the second and fourth micro plasma cells MPC2 and MPC4 do not generate plasma.

In the second section P2, the first and second micro plasma cells MPC1 and MPC2 generate plasma, and the third and fourth micro plasma cells MPC3 and MPC4 do not generate plasma.

The first section P1 and the second section P2 may alternately and repeatedly proceed.

Here, regardless of the sections P1 and P2, the first micro plasma cell MPC1 generates plasma. On the other hand, the second and third micro plasma cells MPC2 and MPC3 selectively generate plasma according to the sections P1 and P2.

For example, if one part of the substrate W does not perform plasma cleaning well compared to the other part, the micro plasma cell MPC1 corresponding to the one part generates plasma regardless of the sections P1 and P2, and the micro plasma cells MPC2 and MPC3 corresponding to the other part selectively generate plasma according to the sections P1 and P2. By doing in this way, the substrate processing result can be made uniform with respect to the entire substrate W.

The methods described with reference to FIGS. 9 to 13 may be combined with each other. For example, the method of FIG. 11 and the method of FIG. 12 may be combined. That is, in the first section P1, the first and fourth micro plasma cells MPC1 and MPC4 generate plasma, but the voltage (energy) provided to the first micro plasma cell MPC1 is different from the voltage (energy) provided to the fourth micro plasma cell MPC4. The second and third micro plasma cells MPC2 and MPC3 do not generate plasma.

In the second section P2, the first and fourth micro plasma cells MPC1 and MPC4 do not generate plasma, and the second and third micro plasma cells MPC2 and MPC3 generate plasma. Here, the voltage (energy) provided to the second micro plasma cell MPC2 is different from the voltage (energy) provided to the third micro plasma cell MPC3.

Figure 14:
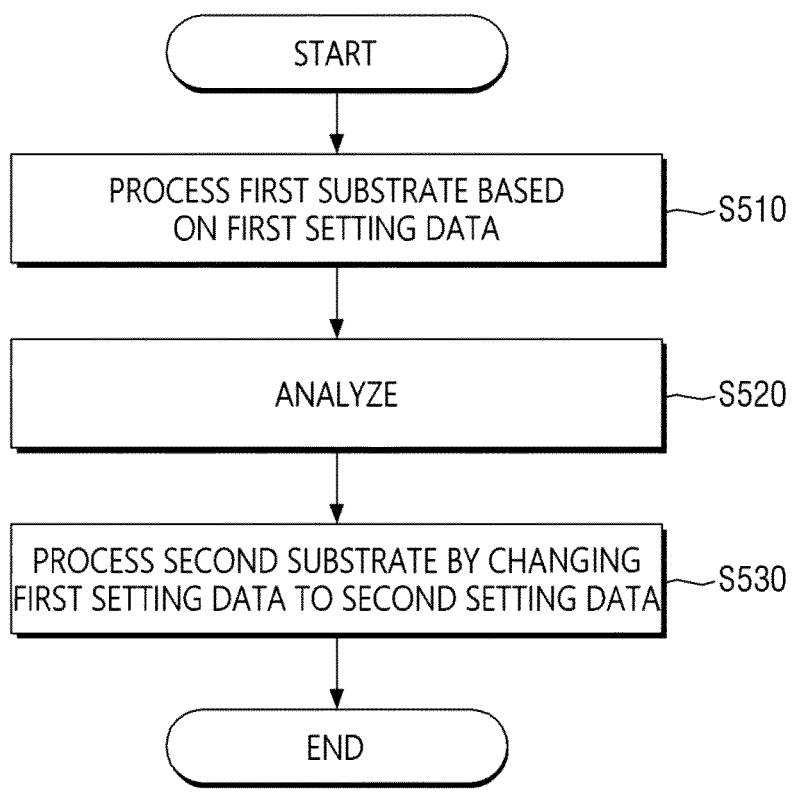
FIG. 14 illustrates a substrate processing method according to a sixth embodiment of the present disclosure.

FIG. 14 illustrates a substrate processing method according to a sixth embodiment of the present disclosure.

Referring to FIG. 14, the first substrate is processed based on the first setting data (S510).

Specifically, "setting data" is data for operating a plurality of micro plasma cells MPC1 to MPC4, and may refers to the voltage level, voltage application time, gas flow rate, ratio, etc. of each micro plasma cell MPC1 to MPC4.

For example, the first setting data may be to generate plasma by supplying a voltage of the same level to all the micro plasma cells MPC1 to MPC4 for the same time period.

Next, the processing result (e.g., cleaning result) of the first substrate is analyzed (S520).

As a result of the analysis, it may be determined that substrate processing (e.g., plasma cleaning) is not performed well for one part of the substrate W compared to the other part.

Subsequently, the second substrate is processed by changing the first setting data to the second setting data (S530).

Specifically, the driving method of the plurality of micro plasma cells MPC1 to MPC4 may be changed by reflecting the analysis result so as to make the substrate processing result uniform for the entire substrate W. As described above, by controlling the application time of the voltage (see FIG. 10), adjusting the level of the voltage (see FIG. 11), or dividing the section for generating plasma (see FIGS. 12 and 13), second setting data may be generated. The second substrate is processed using the newly changed second setting data.

Steps S520 and S530 may be repeated. That is, if the substrate processing result is still not satisfactory as a result of reanalysis after processing the second substrate using the second setting data, the second setting data may be changed to the third setting data.

Although embodiments of the present disclosure have been described with reference to the above and the accompanying drawings, those skilled in the art, to which the present disclosure pertains, can understand that the present disclosure may be practiced in other specific forms without changing its technical spirit or essential features. Therefore, it should be understood that the embodiments described above are illustrative in all respects and not limiting.

What is claimed is:

1. An apparatus for processing a substrate comprising:
a processing space, in which a substrate is disposed; and
a plasma generating module for generating plasma for processing the substrate,
wherein the plasma generating module comprises,
a plurality of first electrodes disposed in parallel with each other in a first direction,
a plurality of second electrodes disposed in parallel with each other in a second direction different from the first direction, and
an array including a plurality of micro plasma cells, wherein each micro plasma cell is connected to corresponding first electrode and second electrode, and generates plasma according a first voltage applied to the corresponding first electrode and a second voltage applied to the corresponding second electrode,
wherein the plurality of micro plasma cells are positioned between the first electrodes and the second electrodes,
wherein each of the plurality of micro plasma cells overlaps a corresponding first electrode and a corresponding second electrode.

2. The apparatus of claim 1, wherein the micro plasma cell comprises,
a plasma forming space,
a first plate disposed on one side of the plasma forming space, in which the corresponding first electrode is installed, and an inlet for introducing a process gas into the plasma forming space is formed, and
a second plate disposed on the other side of the plasma forming space, in which the corresponding second electrode is installed, and an outlet for filtering some components of plasma formed in the plasma forming space is formed.

3. The apparatus of claim 2, wherein the outlet blocks ion components of the plasma and allows radicals of the plasma to pass therethrough.

4. The apparatus of claim 2, wherein the micro plasma cell further comprises a bypass line passing through the plasma forming space to connect the first plate and the second plate, and for delivering a reaction gas to the processing space.

5. The apparatus of claim 2, wherein the micro plasma cell comprises at least one sidewall defining the plasma forming space, and further comprises a bypass line for delivering a reaction gas to the processing space by passing through the sidewall.

6. The apparatus of claim 2, wherein a reaction gas line and a supply hole for providing an unexcited reaction gas to the processing space are further formed in the second plate.

7. The apparatus of claim 1, wherein the first electrode comprises two bus electrodes disposed in parallel with each other.

8. The apparatus of claim 1, wherein a generation amount of the generated plasma is adjusted by adjusting a level of the first voltage or the second voltage.

9. The apparatus of claim 1, wherein the array comprises a first micro plasma cell and a second micro plasma cell that are different from each other,
wherein the first micro plasma cell generates plasma for a first time period,
wherein the second micro plasma cell generates plasma for a second time period different from the first time period.

10. The apparatus of claim 1, wherein the array comprises first, second and third micro plasma cells that are different from each other,
wherein, during a first section, the first and second micro plasma cells generate plasma, and the third micro plasma cell does not generate plasma,
wherein, during a second section continuous to the first section, the first and third micro plasma cells generate plasma and the second micro plasma cell does not generate plasma.

11. The apparatus of claim 10, wherein the first section and the second section alternately and repeatedly proceed.

12. The apparatus of claim 1, wherein the array comprises a plurality of first micro plasma cells and a plurality of second micro plasma cells that are disposed alternately, wherein, during a first section, the plurality of first micro plasma cells generate plasma, and the plurality of second micro plasma cells do not generate plasma,
wherein, during a second section continuous to the first section, the plurality of second micro plasma cells generate plasma, and the plurality of first micro plasma cells do not generate plasma.

13. An apparatus for processing a substrate comprising:
a plasma forming space;
a first plate disposed above the plasma forming space, in which an inlet for introducing a process gas into the plasma forming space is formed;
a second plate disposed under the plasma forming space, in which an outlet for filtering some components of plasma formed in the plasma forming space is formed;
a first electrode included in the first plate and elongated in a first direction;
a second electrode included in the second plate and elongated in a second direction different from the first direction; and
a bypass line passing through the plasma forming space to connect the first plate and the second plate, and for delivering an unexcited reaction gas,
wherein the plasma forming space is located between the first electrode and the second electrode, wherein the plasma forming space overlaps the first electrode and the second electrode.

14. The apparatus of claim 13, wherein the first plate and the second plate include a dielectric,
wherein the first electrode is disposed within the first plate, and the second electrode is disposed within the second plate.

15. The apparatus of claim 14, wherein a plurality of inlets are formed in the first plate, the plurality of inlets are disposed on both sides of the first electrode, the number of the bypass lines is plural, and the plurality of bypass lines are disposed on both sides of the first electrode.

16. The apparatus of claim 13, wherein the process gas comprises an inert gas and a gas comprising a compound comprising at least one of C, N, and F, and the reaction gas comprises a gas comprising a compound comprising at least one of H and N.

17. The apparatus of claim 1, wherein the plurality of second electrodes extend to cross the plurality of first electrodes.

18. The apparatus of claim 13, wherein the second electrode extends to cross the first electrode.

* * * * *